United States Patent [19]
Lepselter et al.

[11] Patent Number: 5,455,427
[45] Date of Patent: Oct. 3, 1995

[54] LITHOGRAPHIC ELECTRON-BEAM EXPOSURE APPARATUS AND METHODS

[75] Inventors: Martin P. Lepselter, Summit; Sheldon M. Kugelmass, Teaneck, both of N.J.

[73] Assignee: Lepton, Inc., Murray Hill, N.J.

[21] Appl. No.: 38,318

[22] Filed: Apr. 28, 1993

[51] Int. Cl.⁶ .................................................. H01J 37/30
[52] U.S. Cl. ............................. 250/492.23; 250/492.22; 250/396 R
[58] Field of Search ............... 250/492.2, 492.22, 250/492.21, 492.23, 396 R, 398; 219/121.25, 121.26

[56] References Cited

U.S. PATENT DOCUMENTS

| | | | |
|---|---|---|---|
| 4,153,843 | 5/1979 | Pease | 250/492.2 |
| 5,051,556 | 9/1991 | Sakamoto et al. | 250/492.22 |
| 5,130,547 | 7/1992 | Sakamoto et al. | 250/492.22 |
| 5,153,441 | 10/1992 | Moriizumi | 250/492.23 |

FOREIGN PATENT DOCUMENTS 57-206029  12/1982  Japan ........................... 250/492.23

Primary Examiner—Jack I. Berman
Assistant Examiner—James Beyer
Attorney, Agent, or Firm—Stanger, Dreyfus & Shapiro

[57] ABSTRACT

An apparatus for exposing a radiation sensitive workpiece to define patterns therein includes an electron gun, a mask with spaced apertures for passing electron radiation, and a radiation deflector-blanker to direct the radiation to selected ones of the apertures and to form separate beamlets from the apertures then demagnify the separate beamlets and direct them onto the workpiece without crossing them. In one embodiment, the groups of apertures are fixed on the mask and define fixed undivided profiles in the path of the radiation.

10 Claims, 6 Drawing Sheets

LITHOGRAPHIC ELECTRON-BEAM EXPOSURE APPARATUS AND METHODS

BACKGROUND OF THE INVENTION

This invention relates to electron-beam exposure machines for accurate submicron lithography, particularly for writing on optical and x-ray mask surfaces or directly on semi-conductor surfaces.

Some electron-beam writing pattern systems scan with a single beam for writing individual pixels on the resist layer of a semiconductor workpiece. Each pixel requires a combination of a range of an exposure time and current density. This pixel by pixel approach limits the throughput of such systems.

Some industrial writing-pattern systems use larger, variably shaped apertures to write patterns. Such systems have the disadvantages of producing the same current density with each shape, so that changing the shape area results in current changes and hence variation in bulk space charge within the electron beam. This may alter the plane of best focus and allow proper focusing of only one area. As the shape size increases, electron to electron interaction increases and the beam broadens and the edge sharpness decreases. Also, the continually changing beam current makes it difficult to maintain a stable column.

U.S. Pat. No. 4,153,843 discloses a system that forms the patterns from an m×n array of fixed identical spots each of which receives on or off signals to produce the desired pattern. Such a system requires complex electronic drives to form the desired patterns. Also the system causes the beams from the apertures to recross at a focus point.

An object of the invention is to overcome these disadvantages.

Another object of the invention is to improve electron-beam pattern writing systems.

Another object of the invention is to improve the throughput of electron-beam pattern writing systems.

SUMMARY OF THE INVENTION

According to a feature of the invention, these objects are attained, in whole or in part, by selectively exposing a group of small apertures arranged in a desired formation to form a plurality of separate beamlets, and continuously maintaining the beamlets separate while imaging the beamlets onto a workpiece in a pattern.

Another feature of the invention involves making a second exposure and imaging the separate beamlets to complete a second pattern.

Yet another feature involves interleaving the first pattern with the second pattern.

According to another feature, the invention involves selectively exposing all the apertures in an undivided one of a small finite number of groups of small fixed apertures to form the plurality of separate beamlets from the apertures.

According to another feature of the invention, the groups or apertures are in the form of squares, rectangles, triangles, trapezoids, parallelograms, hexagrams, hexagons, etc., with identical spots forming each of the symbols.

According to another feature of the invention, a deflection system selects a desired one of the groups in turn to produce the desired shape.

According to another feature of the invention, suitable means perturb the beam that exposes the selected groups over the extent of the group so as spatially to change the position of the peak of the intensity in the gaussian distribution of the beam within the exposure time of the group.

These and other feature of the invention are pointed out in the claims. Other objects and advantages of the invention will become evident when read in light of the accompanying drawings.

DETAILED DESCRIPTION OF PREFERRED EMBODIMENTS

Figure 1:
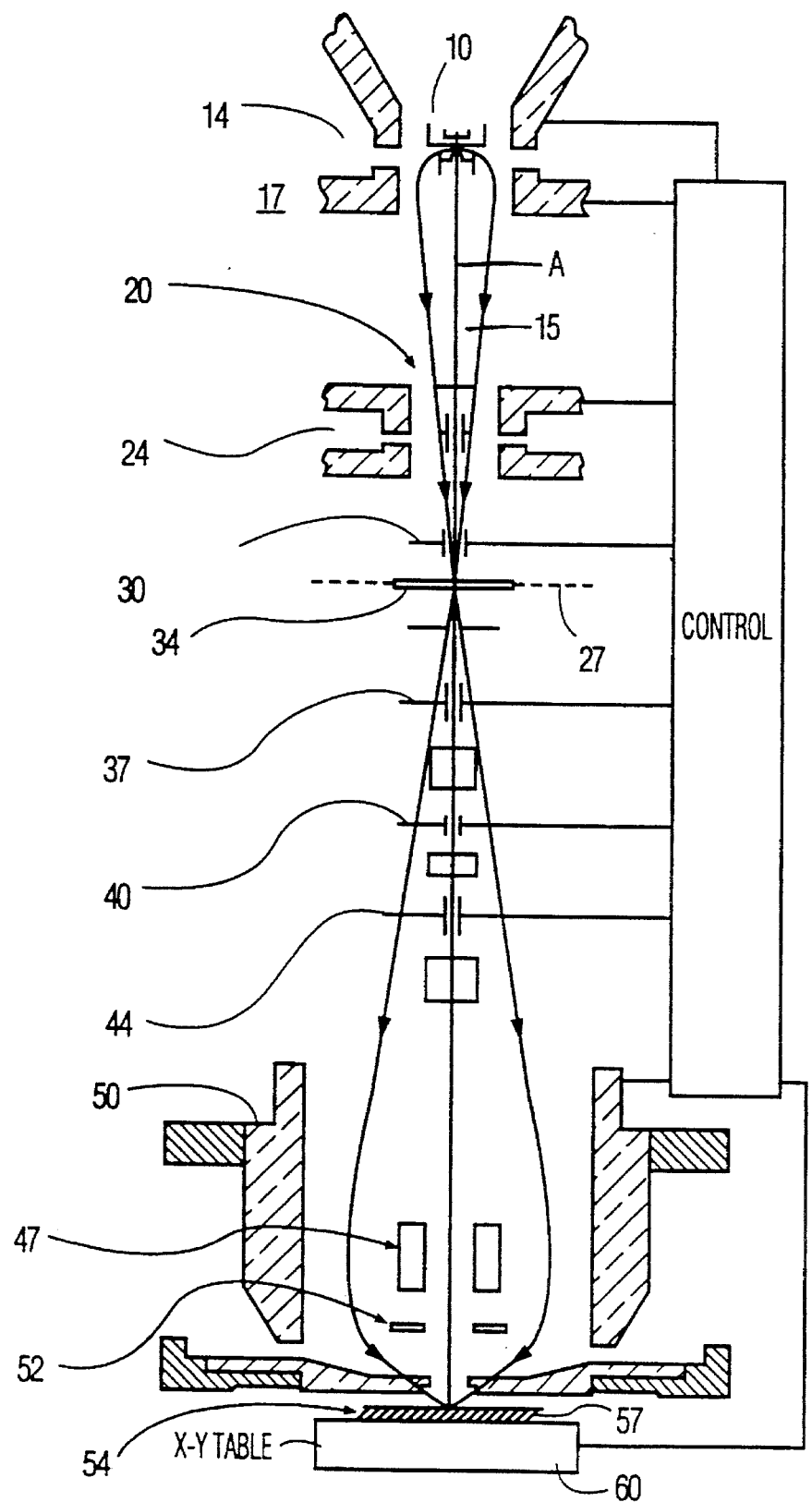
FIG. 1 is a schematic representation of an electron-beam exposure system embodying features of the invention.

In the electron-beam exposure system of FIG. 1, a field emission electron gun 10 and a first lens 14 constitute an electron source 17 which directs a beam 15 of electrons about an axis A toward a beam limiting aperture 20 of 200 µm. A second lens 24 with an auxiliary blanker converges the resulting electron beam 15 and directs it toward a crossover or focus plane 27 and between selector deflection plates 30.

An apertured mask 34 at the crossover plane 27 divides the beam 15 into individual beamlets according to a profile selected by the selector deflection plates 30. A set of secondary deflection plates 37, 4 µm deflection plates 40, and secondary deflection plates 44 as well as 512 µm deflection coils 47 deflect the beamlets that now form the beam 15 in a manner described with respect to FIGS. 2 to 4. The two sets of deflection plates 37 and 44 work together as a unit. A third lens assembly 50 demagnifies the beams emerging from the mask 34 and, with a fast focus correction coil 52, focuses the beams on the writing surface 54 of a workpiece 57.

The writing surface 54 is the top surface of an electron-sensitive layer supported on a substrate in the workpiece 57. A conventional x-y movable table 60 controls the position of the workpiece 57 relative to the beam.

Selectively imaging selected fixed groups of electron spots over the surface of the writing surface 54 on the electron sensitive layer in a high-speed manner makes it possible to create integrated-circuit masks or to write directly on a resist-coated wafer to fabricate extremely small and precise low-cost integrated circuits.

The members 10 to 52 constitute an electron-beam column having highly accurate high-speed deflection capabilities. As shown in FIG. 1, the paths of the electrons emitted by this source successively diverge, converge, diverge again, and converge again as the electrons travel downstream along a longitudinal axis toward the writing surface 54.

Figure 2:
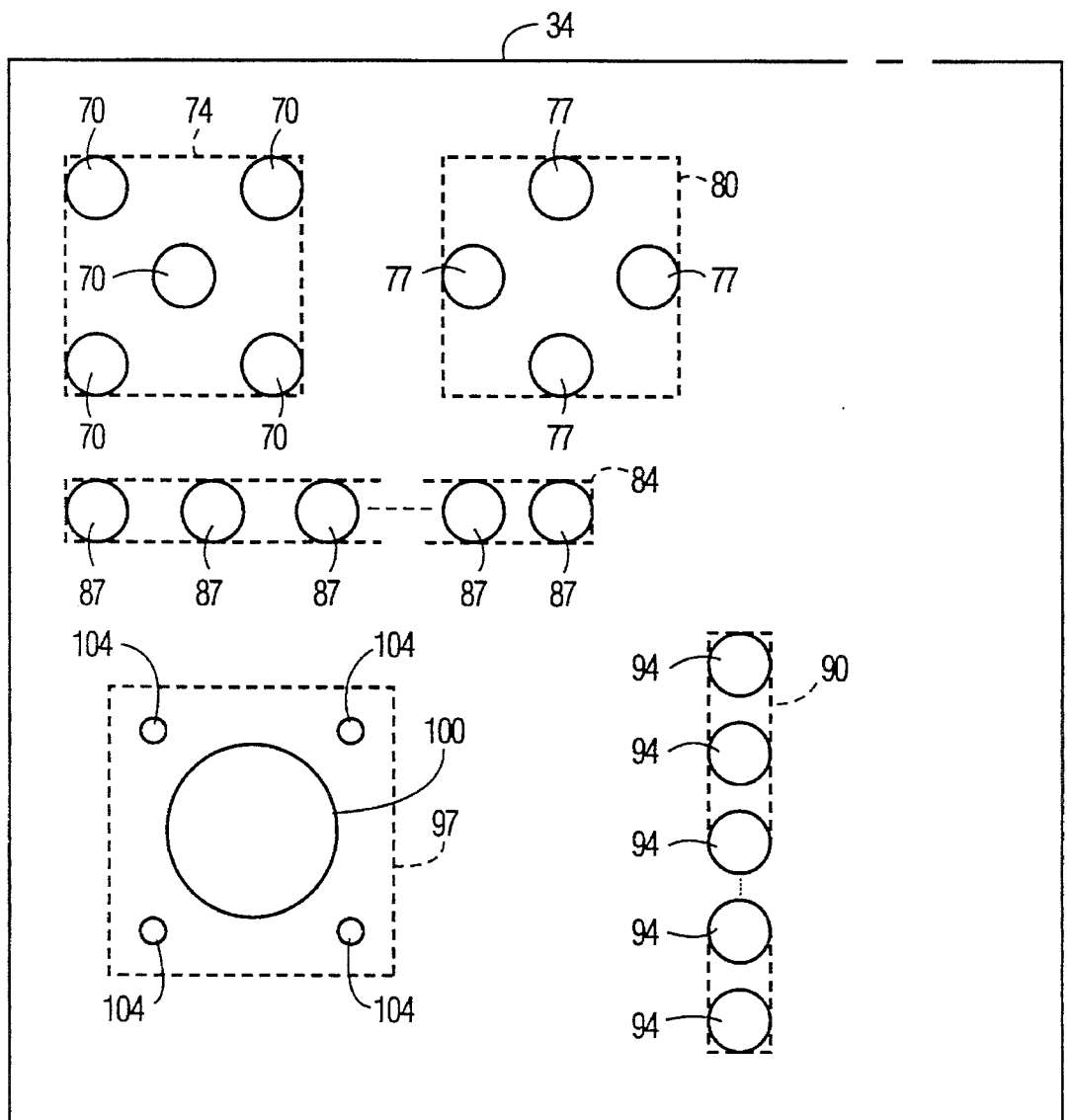
FIGS. 2 and 3 are schematic representations of a membrane having apertures for use in the embodiment of FIG. 1.

FIG. 2 illustrates details of the mask 34. Here five spaced apertures 70 lie in the four corners and the middle of a profile 74 in the shape of a square. Four spaced apertures 77 sit in the middle of four edges of a square profile 80 whose spatial extent is identical to that of the profile 74. An elongated horizontal profile 84 defines five spaced and aligned apertures 87 while a vertical elongated profile 90 outlines five spaced and aligned apertures 94. Another square profile 97 delineates a large central aperture 100 and four corner apertures 104.

The deflector plates 30 shift the beam 15 to strike over the entire area of any one and only one of the profiles 70, 80, 84, 94, or 97. When the selector deflection plates 30 cause the beam 15 to strike the entire area and only the area of the profile 74 the apertures 70 separate the beam 15 into five beamlets that focus on the writing surface 54 of the workpiece 57. Similarly, when the selector deflection plates 30 cause the beam 15 to strike the entire area and only the area of any one of the profile 80, 84, 94, or 97 the respective apertures 77, 87, 94, and 100 and 104 separate the beam 15 into respective beamlets that focus on the writing surface 54 of the workpiece 57.

The apertures are a fraction of the total area of the profiles. The diameters of the apertures are small enough in light of the current to make the electron beamlets sufficiently narrow so that electron space charges do not adversely affect the edge sharpness. The apertures 70 are far enough apart from each other to prevent the electron charges in the beamlets from repelling each other during transit along the axis A and distorting the aperture beamlet and therefore its image. Similarly the apertures 77 are far enough from each other, the apertures 87 from each other, the apertures 94 from each other, and the apertures 104 and 100 far enough from each other to prevent the electron charges in the beamlets from repelling each other and distorting the writing.

Upon striking the writing surface 54, the electrons scatter in all directions and expand the spot which any of the electron beamlets forming the electron beam 15 writes. This enlarges the spots that the beamlets write. The lens assembly 50 demagnifies the sizes of the aperture images on the writing surface eight times. Hence the apertures 70 77, 87, 94, 100, and 104 are each eight times the striking size of the spots which the column writes on the surface 54 of the workpiece 57 before the electrons scatter but after striking the surface.

The system develops a shape of any configuration on the writing surface 54, by having the x-y selector deflection plates 30 confine the beam 15 onto the entire area of one or more of the profiles 74, 80, 84, 90, or 97 so as first to write an image of the apertures 70, 77, 87, 94, or 100 and 104 on the writing surface 54. The x-y selector deflection plates 30 then confine the beam 15 onto the entire area of the same or one of the other profiles 74, 80, 84, 90, or 97 to write another image of the same or other apertures 70, 77, 87, 94, or 100 and 104 on the writing surface 54. Each of the spots formed by the images expands when, upon striking the writing surface 54, the electrons scatter in all directions, and the spots of the first images merge into the spots of the succeeding images to form the desired shape. The lens assembly 50 demagnifies the images 170 and 177 of the apertures 70 and 77 by an eight times reduction ratio to one-eighth of the aperture size.

Figure 3:
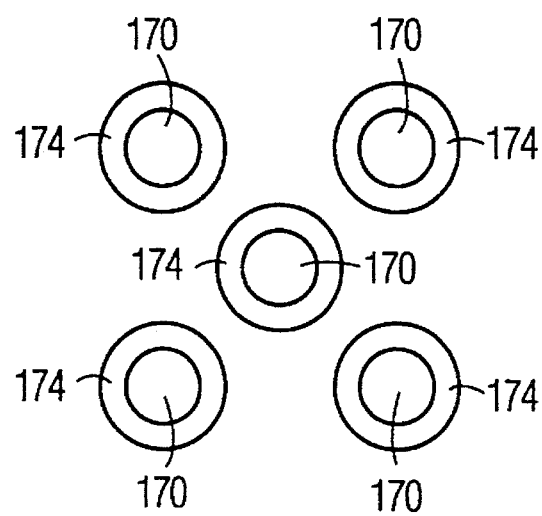
Figure 4:
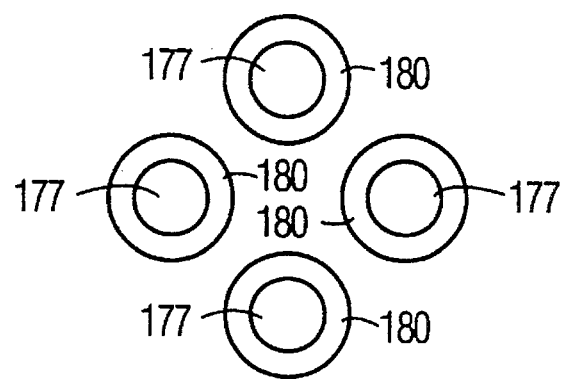
FIGS. 4 and 5 are schematic representations of the incident image and the resulting deposited charge distributions in a workpiece in the system of FIG. 1.
Figure 5:
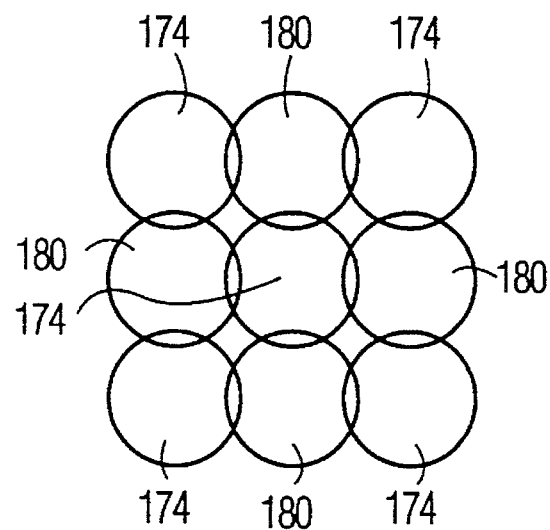

An example of this writing technique appears in FIGS. 3 and 4. FIG. 3 illustrates images 170, corresponding to the apertures 70, as they might appear as the beamlets from these apertures strike the writing surface 54 after demagnification when the x-y deflector plates 30 direct the beam 15 onto the profile 74. The lens assembly 50 demagnifies the images 170 and 177 of the apertures 70 and 77 by an eight times reduction ratio to one-eighth of the aperture size. Each image 170 expands into a spot 174 as a result of scattering of the electrons as they enter the resist material in the workpiece 57. FIG. 4 shows images 177, corresponding to the apertures 77, as they might appear as the beamlets from these apertures strike the writing surface 54 after demagnification when the x-y deflector plates 30 direct the beam 15 onto the profile 74. Each image 177 expands into a spot 180 as a result of scattering of the electrons as they enter the resist material in the workpiece 57. FIG. 5 depicts the result of the selector plates 30 first directing the beam 15 onto the area of the profile 74 to write the spots 174 in FIG. 3 and then directing the beam 15 onto the area of the profile 180 to interleave the spots 180 with the spots 174 on the writing surface 54. In this manner the system writes a square on the writing surface 54.

It is the deflection system 40 which adjusts the position of each beamlet group on the workpiece surface relative to the workpiece position and to the positions of previous writings. For example, it is the deflection system 40 that interleaves the images of FIG. 3 and 4 to create the result in FIG. 5.

In this manner the system writes a square with only two exposures of the writing surface 54. This results in an increase in the speed of the through-put of the workpiece 57 without the distortion created by variably shaped apertures to write the patterns. It provides for substantial sharpness in the plane of best focus. On the other hand, writing by scanning with a single spot would require nine exposures. The exposure time for a group such as 70, 77, 87, 94, 100, and 104 is the same as the exposure time for a single pixel as long as the current density per spot is the same as a single pixel.

The system determines the location of the writing on the surface 54 with the deflection plates 37, 40, and 44, and the deflection coil 47 as well as the position table 60. The control c adjusts the operation of the deflection plates 37, 40, 44, and deflection coil 47 as well as the table 60.

Figure 6:
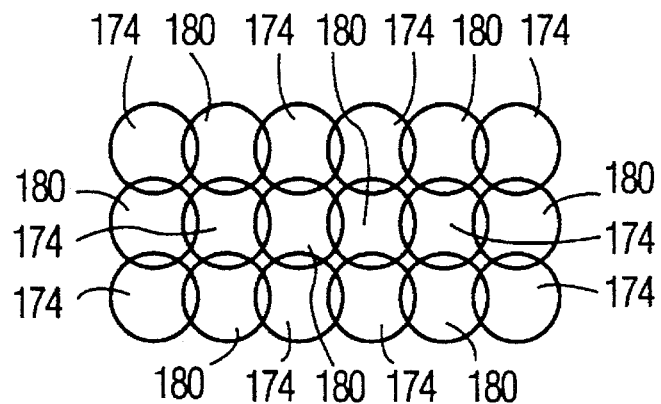
FIG. 6 is a schematic representation of the deposited charge distributions when the distributions of FIG. 5 are interleaved with the distributions of FIG. 4.
Figure 7:
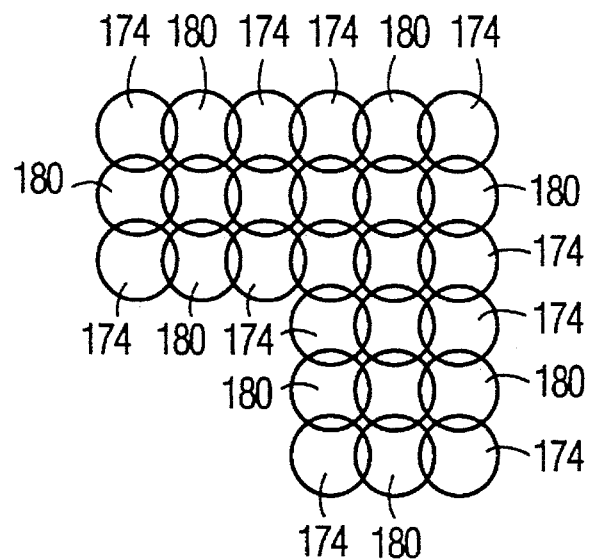
FIG. 7 is a schematic representation of another example of sequentially deposited charge distributions which extend the form of the type deposited in FIG. 6.
Figure 8:
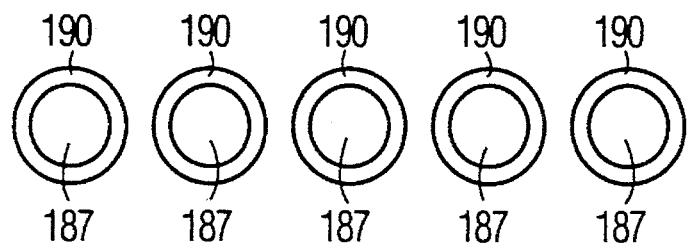
FIG. 8 is a schematic representation of another example of sequentially deposited charge distributions which extend the form of the type deposited in FIG. 6.
Figure 9:
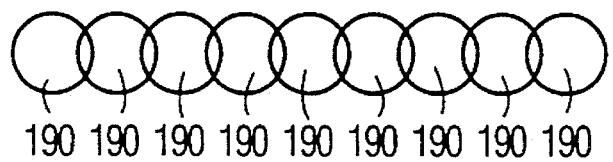
FIGS. 9 and 10 are schematic representations of deposited charge distributions for writing a straight line with an aperture group in FIG. 2.

FIG. 6 illustrates a rectangle formed by combining two squares of the type shown in FIG. 5. Four exposures produce results which spot scanning would require 18 exposures. FIG. 7 illustrates an L shape formed by six exposures as compared by 27 exposures with single spots scanning would require. FIGS. 8 and 9 illustrate the manner of forming a line with the mask 34. Here, a single exposure of the apertures 87 in the profile 84 produces five images 187 and five spots 190 spaced from each other. Interleaving a second series of spots 190 with those shown in FIG. 8 produces the line in FIG. 9. Two exposures result in the writing equivalent of ten scanned single spots. Similarly, the system produces a vertical line with the apertures 94. According to another embodiment of the invention, four exposures produce a double line.

Figure 10:
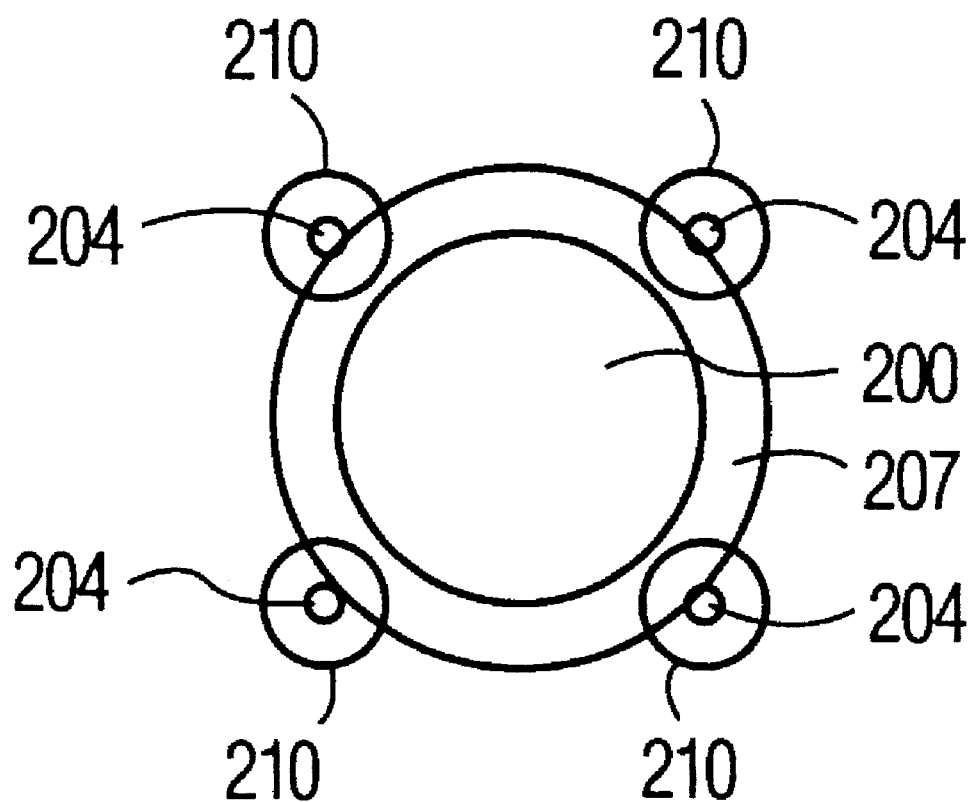

FIG. 10 illustrates the manner in which the system produces a square with a single exposure of the apertures 100 and 104 in the profile 97. Images 200 corresponding to the aperture 100, and images 204 corresponding to apertures 104 expand into spots 207 and 210 when the electrons scatter in all directions upon entering the writing surface 54. The spots 207 and 210 merge into each other to form a substantially square pattern. A single exposure results in what otherwise would have required five exposures with a single spot scanning system.

According to an embodiment of the invention, the aperture 100 in the mask 34 forms one profile and the aperture 104 forms a second profile so that the result in FIG. 10 follows from two exposures, one from the central spot 207 and a second exposure from the peripheral spots 210.

The electron beam column 10 to 52 writes on the writing surface 54 within 4 μm by 4 μm exposure cells. During the writing the 512 μm deflection system 47 constantly moves the writing position in the y-direction. The constant motion of the x-y table 60 moves the writing position in the x-direction. That is to say a y-scan deflects the beam approximately 40 nanometers (nm) during the short dwell time required to perform a single exposure. In order to write effectively upon a 4 μm by 4 μm exposure cell, the secondary electrostatic deflection system 44 provides a ramped retarding deflection to hold the net x-y deflections constant during the time that the 512 μm system 47 scans over a particular 4 μm exposure cell. This generates an effective raster-scan. As this two-part deflection system scans the writing window over a 4 μm exposure cell, the fast 4 μm electrostatic deflection plates 40 deflects the beamlets to properly locate all exposures within the cell.

Figure 11:
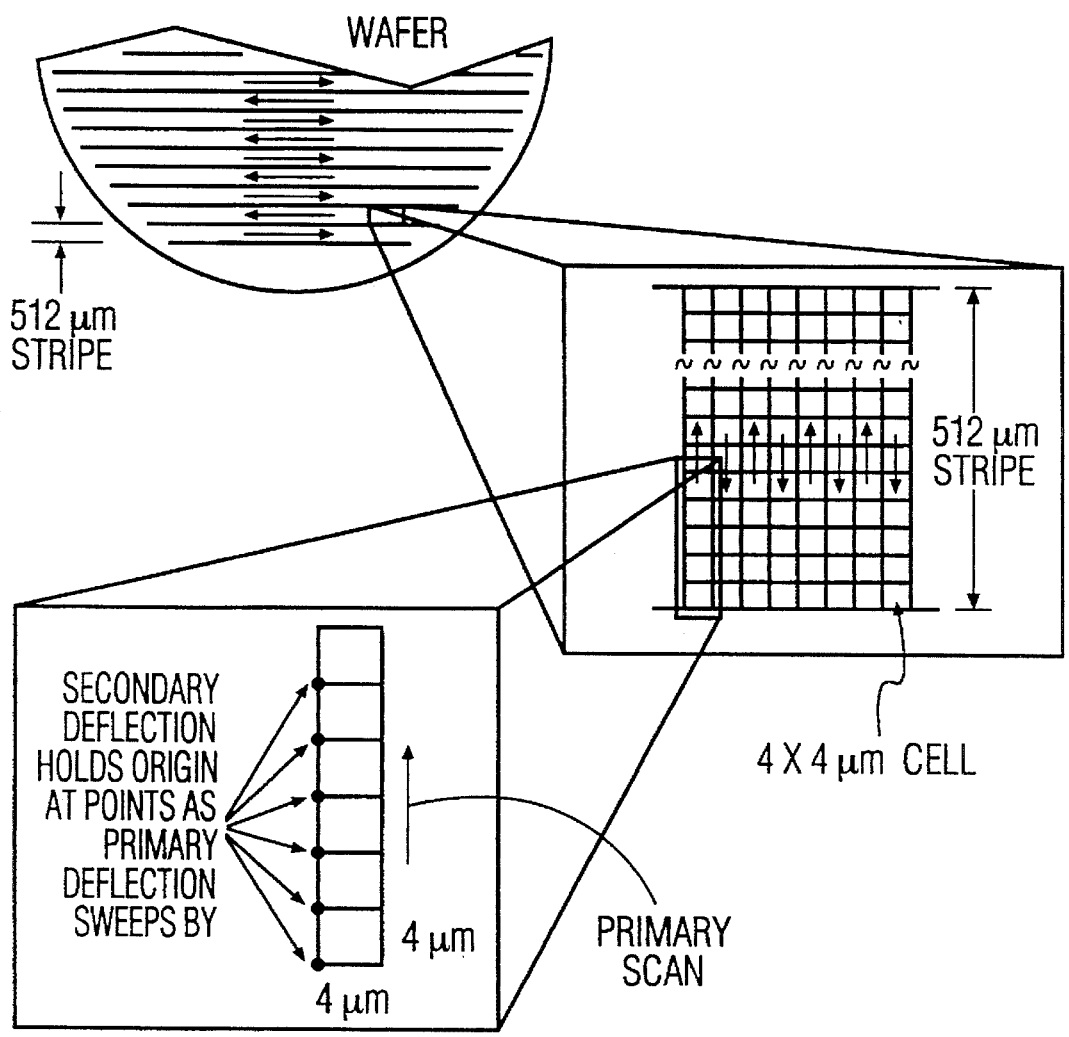
FIG. 11 is a schematic representation of the writing arrangement according to a feature of the invention.

Each primary 512 μm scan generated by the deflection coils 47 traverses a column 304 of 128 4 μm exposure cells. As the deflection completes each column 304 the 512 μm deflection coils reverse the direction of the scan in order to write an adjacent column. Adjacent columns form 512 μm stripes 307 as shown in FIG. 11. At the end of a stripe the table 60 reverses direction to begin writing an adjacent stripe.

The invention furnishes a system of electron beam lithography that permits a high through-put, direct-write system for application to lithography in the production of gates, contacts, vias, and metallization in the 0.18 μm size range. The increase in through-put results from replacing a single beam with a group of non-interacting beamlets. The invention applies the electron beam 15 over the silicon membrane mask 34 that contains apertures 70, 77, 87, 94, 100, and 104 in multiple aperture groups 74, 80, 84, 90, and 97 which form primitives for gates, contacts, vias, and metal. One embodiment of the invention uses only identical spot sizes.

According to an embodiment of the invention the column scans the electron beam 15 over the silicon membrane mask 34. The scanning separates the beamlets temporally and the spacing of the apertures separates the beams spatially to limit electron-electron interactions and the resulting beam broadening.

The selector deflection plates 30 select and exposes the aperture groups and deflection plates 37, 40, and 44 and deflection coils 47 locate them and overlay them as necessary. The demagnifying lens assembly 50 in the column demagnifies the images of the resulting beamlets and directs them to the writing surface 54.

The invention avoids anomalous beam broadening due to space charge effects without requiring lowering the beam current which lowering would otherwise offset any through-put gains. The invention utilizes non-interacting beamlets and thus permits maintaining the beam current density at levels used for single pixel writing. The electron gun 10 is a high current electron source of the type employed by the EBES4 system furnishes the beam current and spot size required to expose multiple pixels. A description of the EBES4 system appears in the article "The EBES4 Electron-Beam Column" by M. G. R. Thomson et al in the Journal of Vacuum Science and Technology, B 5(1), January/February 1987, published by the American Vacuum Society.

The invention employs a deflection strategy based on linear raster-scan in both the x and y-direction. A constant velocity stage motion produces the primary x-scan. A linear scan of the primary magnetic deflection coils provides the primary y-scan. A secondary electrostatic deflection system superimposes a retarding deflection in the x-y directions in order to generate an effective step raster-scan of the exposure cell. This eliminates long settling times associated with step raster-scan writing. A high speed electrostatic deflection system in the vector-scan mode addresses and exposes individual figures in the exposure cell.

The invention exploits the advantages of e-beam direct-write; namely, the benefits of overlay, critical dimension (CD) control and depth of focus as applied to the patterning of contact windows and metallization. It derives a clear through-put benefit by increasing the area addressed in a single exposure. It uses an EBES4 current source in the form of electron gun 10 and the type of fast deflection systems found therein to furnish sufficient beam current to allow an increase in the beam size without a loss of current density. For example, the EBES4 system can furnish a current density of 1600 A/cm$^2$ (250 nA at a spot size at the writing surface of 0.125 μm) and a beam current as high as 2.25 μA. The deflection electronics is capable of generating pixel dwell times as short as 2 ns (500 MHz switching).

The invention overcomes the limitations of traditional-shaped beam systems such as beam broadening caused by space charge effects. To operate, those systems must use lower beam currents thereby offsetting the through-put gains arising from the increased area exposure. The invention exposes an increased area by generating a number of individual electron beamlets. According to one embodiment the system accomplishes this by scanning the beam over a number of apertures in a silicon membrane structure located at the blanker plane of the electron beam column. The membrane mask 34 contains apertures 70, 77, 87, 94, 100, and 104 in a number of aperture groups 74, 80, 84, 90, and 97 that provide figure primitives for construction of the desired pattern. The array of apertures 70, 77, 87, 94, 100, and 104 forming a figure primitive minimizes interactions between the beamlets formed by illumination of the array. Because the beamlets are non-interacting, an apparatus according to the invention can maintain the beam current density at levels suitable for single pixel writing and thus suffer no through-put degradation arising from lowered beam current.

One embodiment superimposes a low level, periodic deflection signal at the aperture plane, and thus introduces a temporal distribution or perturbation in the exposure of apertures within the figure primitives 74, 80, 84, 90, and 97. Within the time scale of such perturbation, the electron packet, which illumination of an individual aperture generates, travels along the column axis and further reduces its interactions with other beamlet packets, which illumination of other apertures generates, during the same overall exposure. The two packets are separated in time and thus in phase as a result of the perturbation. The exposure of the inter-pixel regions occurs on superposition of deposited energy profiles of the individual pixels.

The continuously separate beamlets produce at least a multi-spot portion of a desired pattern with a single exposure and at the same time limit the electron to electron interaction between electrons of the separate beams and thereby avoid the broadening effects of the shaped aperture system.

In one of its aspects, the invention corresponds to forming a desired vast number of shapes corresponding to "words" from any "alphabet" of groups or primitives, created from smaller spots.

While embodiments of the invention have been described in detail, it will be evident to those skilled in the art that the invention may be embodied otherwise without departing from its spirit and scope.

What is claimed is:

1. A method for exposing a radiation sensitive workpiece to defined patterns therein, comprising:

producing a beam of electron radiation from a source at a given position;

exposing a selected aperture pattern in a first format on a mask to the beam of electron radiation from the source to form a first beamlet pattern from the aperture pattern, said mask having a second aperture pattern in a second format complementary to the first format with respect to a desired image;

demagnifying the beamlet pattern and directing it onto the workpiece;

thereafter exposing the second aperture pattern in a second format complementary to the first format on said mask to said source of electron radiation to form a second beamlet pattern from the aperture pattern;

demagnifying the second beamlet pattern and directing it onto the workpiece at a position overlapping the first beamlet pattern to form a sum image of the first and second beamlet patterns.

2. A method as in claim 1, wherein the step of exposing the second aperture pattern to the beam electron radiation from the source includes deflecting the beam laterally in the plane of the mask for exposing the selected aperture pattern in a second format to the source of radiation.

3. The method as in claim 1, wherein said step producing the beam of radiation includes maintaining the beam of radiation in one position for the step of exposing a selected aperture pattern in a first format on said mask and in a second position for the step of exposing the second aperture pattern in a second format complementary to the first format on said mask.

4. A method as in claim 3, wherein the step of exposing the second aperture pattern to the beam electron radiation from the source includes deflecting the beam laterally in plane of the mask for exposing the selected aperture pattern in a second format to the source of radiation.

5. A method for exposing a radiation sensitive workpiece to defined patterns therein, comprising:

directing a source of electron radiation along a beam;

exposing a first plurality of spaced apertures in a first format to the beam from said source for forming a first set of separate beamlets from the apertures, said mask having a second plurality of spaced apertures in a second format complementary with said first plurality of spaced apertures with respect to a predetermined appearance;

demagnifying the separate beamlets and directing them onto the workpiece before crossing the beamlets with each other;

therafter exposing the second plurality of spaced apertures on said mask to the source of electron radiation to form a second set of separate beamlets;

demagnifying the separate beamlets of said second set and directing them onto the workpiece before crossing the beamlets with each other to produce a composite overlapping sum image on the workpiece.

6. A method as in claim 5, wherein the step of directing the beam includes maintaining the beam in one position for exposing the first plurality of spaced apertures and in a second position for exposing the second plurality of spaced apertures.

7. A method as in claim 5, wherein the mask has a plane, and the step of exposing the second plurality of spaced apertures includes deflecting the beam laterally along the plane of the mask.

8. A method as in claim 7, wherein the step of directing the beam includes maintaining the beam in one position for exposing the first plurality of spaced apertures and in a second position for exposing the second plurality of spaced apertures.

9. A method as in claim 5, wherein the step of exposing a first plurality of spaced apertures in a first format to the beam from said source and the step of then exposing the second plurality of spaced apertures to the source of electron radiation included forming the sets of beamlets so that images of the sets of beamlets interleave at said workpiece to assume an image that is the positive sum of the from the first and second exposure sets.

10. A method as in claim 5, wherein the apertures in each plurality of apertures are spaced from each other so that each plurality of spaced apertures form images which are fraction of the total area of the overlapping image to prevent the electron charges in the beamlets from repelling each other during transit.

* * * * *